(12) United States Patent
Gao

(10) Patent No.: US 10,667,437 B2
(45) Date of Patent: May 26, 2020

(54) LIQUID DISTRIBUTION UNIT DESIGN FOR LIQUID COOLING OF ELECTRONIC RACKS OF A DATA CENTER

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

(*) Notice: Subject to any disclaimer, the term of this patent is extended or adjusted under 35 U.S.C. 154(b) by 192 days.

(21) Appl. No.: 15/951,860

(22) Filed: Apr. 12, 2018

(65) Prior Publication Data

US 2019/0320548 A1    Oct. 17, 2019

(51) Int. Cl.
  H05K 7/20   (2006.01)
  H05K 7/14   (2006.01)
  H05K 7/18   (2006.01)

(52) U.S. Cl.
  CPC .......... H05K 7/208 (2013.01); H05K 7/1487 (2013.01); H05K 7/1488 (2013.01); H05K 7/18 (2013.01)

(58) Field of Classification Search
  CPC .......... H05K 7/20781; H05K 7/20772; H05K 7/20836; H05K 7/20736; H05K 7/20763; H05K 7/20218; H05K 7/20254; H05K 7/20272; H05K 7/20572; H05K 7/20809; H05K 7/20818; H05K 7/20327; H05K 7/20645; H05K 7/20609; H05K 7/20627; H05K 7/20336; H05K 7/202; H05K 7/20636; H05K 7/20263; H05K 7/20509; H05K 7/20936; H05K 7/20; H05K 7/2039; H05K 7/20709; H05K 7/20281; H05K 7/2029; H05K 7/207; H05K 7/14; H05K 7/20663; H05K 7/20681; H05K 7/208; H01L 23/427; G06F 1/20; G06F 2200/201; G06F 1/206

See application file for complete search history.

(56) References Cited

U.S. PATENT DOCUMENTS 3,212,274 A * 10/1965 Eidus ................ F25B 21/04
                                                    62/3.4
4,448,239 A *  5/1984 Edwards ........... F28D 15/0275
                                                    165/104.14
5,297,621 A *  3/1994 Taraci ............... G01R 31/2891
                                                    165/104.13

(Continued)

*Primary Examiner* — Jayprakash N Gandhi
*Assistant Examiner* — Michael A Matey
(74) *Attorney, Agent, or Firm* — Womble Bond Dickinson (US) LLP

(57) ABSTRACT

An electronic rack liquid cooling system includes a rack manifold having a rack liquid supply line or channel and a rack liquid return line or channel. The liquid supply line is to receive first cooling liquid from a cooling liquid source and the liquid return line is to return first warmer liquid carrying the exchanged heat back to the cooling liquid source. The electronic rack further includes an array of server blades arranged in a stack therein. Each server blade includes one or more liquid cold plates associated with one or more information technology (IT) components. The electronic rack further includes a set of one or more liquid distribution units (LDUs) coupled between the rack liquid supply and return lines and the server blades. Each LDU includes an LDU container, a liquid supply port, a liquid return port, one or more pairs of supply sub-ports and return sub-ports, and a heat exchange channel or tube.

17 Claims, 11 Drawing Sheets

(56) References Cited

U.S. PATENT DOCUMENTS

| | | | | |
|---|---|---|---|---|
| 7,165,412 B1* | 1/2007 | Bean, Jr. | F25B 25/005 | 165/80.4 |
| 7,318,322 B2* | 1/2008 | Ota | H05K 7/20781 | 62/259.2 |
| 7,450,385 B1* | 11/2008 | Campbell | H05K 7/20772 | 165/80.4 |
| 8,490,679 B2* | 7/2013 | Campbell | F28D 15/02 | 165/80.2 |
| 2006/0002080 A1* | 1/2006 | Leija | H05K 7/20772 | 361/679.46 |
| 2006/0126293 A1* | 6/2006 | Campbell | H05K 7/2079 | 361/699 |
| 2006/0126296 A1* | 6/2006 | Campbell | H05K 7/20781 | 361/700 |
| 2010/0002393 A1* | 1/2010 | Campbell | H05K 7/20772 | 361/699 |
| 2010/0118494 A1* | 5/2010 | Campbell | H05K 7/20772 | 361/701 |
| 2011/0134604 A1* | 6/2011 | Attlesey | G06F 1/20 | 361/679.47 |
| 2012/0026691 A1* | 2/2012 | Campbell | H05K 7/20781 | 361/700 |
| 2013/0021746 A1* | 1/2013 | Campbell | H05K 7/20145 | 361/679.47 |
| 2013/0343005 A1* | 12/2013 | David | H05K 13/00 | 361/721 |
| 2014/0069111 A1* | 3/2014 | Campbell | B21D 53/02 | 62/3.2 |
| 2014/0202678 A1* | 7/2014 | Goth | H05K 7/20772 | 165/287 |
| 2015/0109730 A1* | 4/2015 | Campbell | H05K 7/20809 | 361/679.53 |
| 2016/0242318 A1* | 8/2016 | Krug, Jr. | H05K 7/20772 | |
| 2017/0177041 A1* | 6/2017 | Shelnutt | G06F 1/20 | |
| 2017/0181325 A1* | 6/2017 | Shelnutt | H05K 7/20781 | |
| 2018/0279510 A1* | 9/2018 | Johnson | H05K 7/20772 | |
| 2019/0182990 A1* | 6/2019 | Chen | H05K 7/20818 | |

* cited by examiner

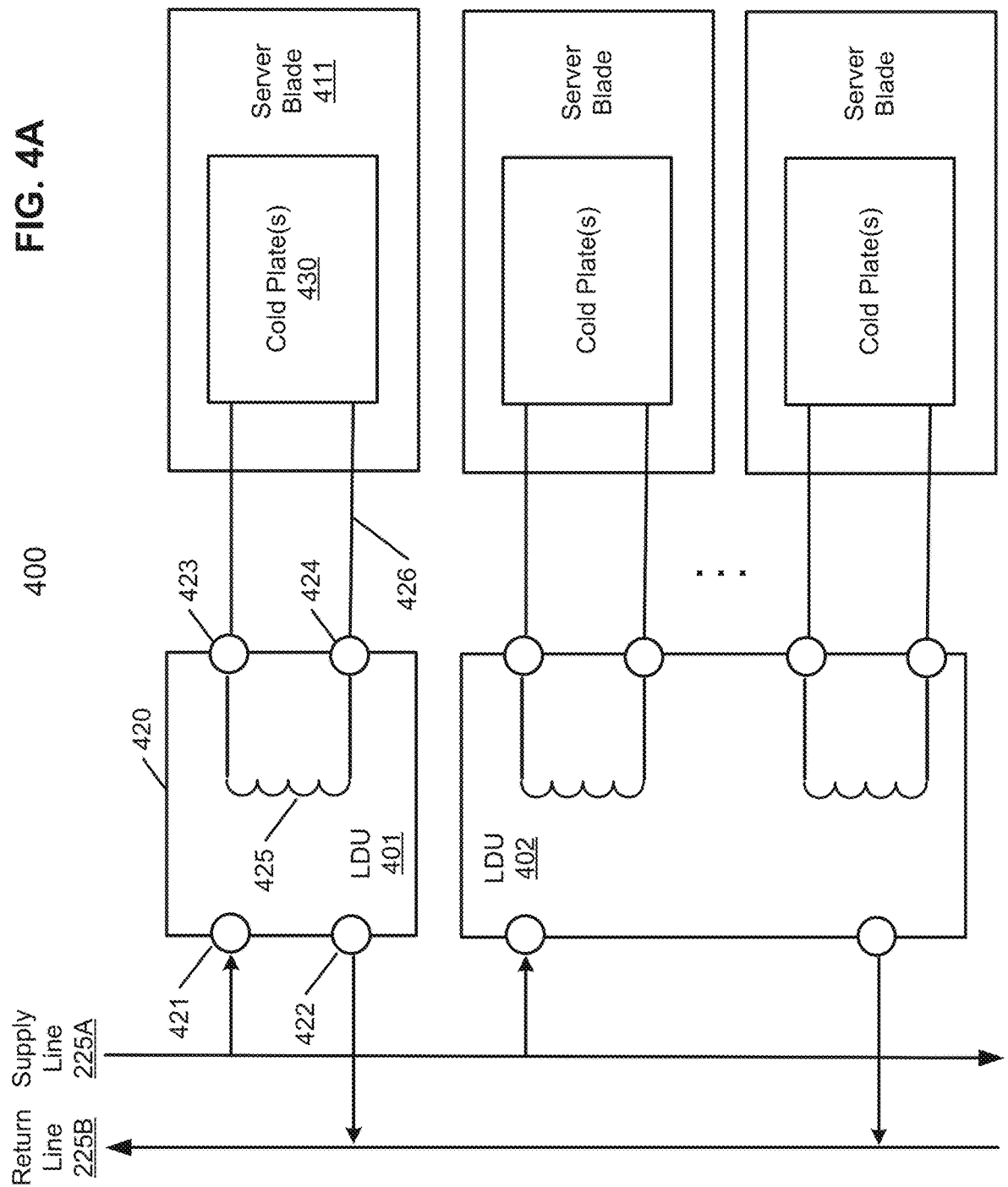

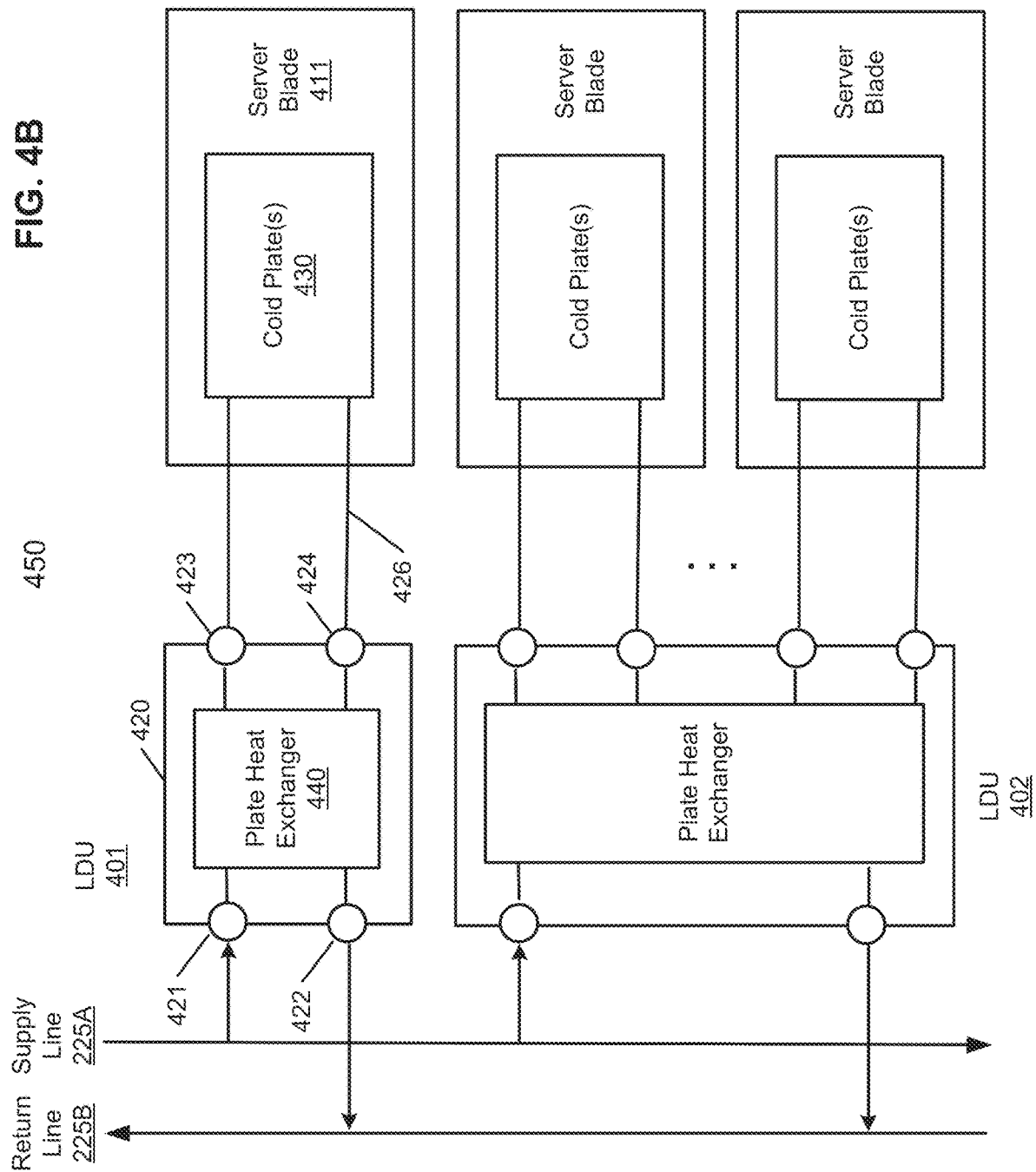

LIQUID DISTRIBUTION UNIT DESIGN FOR LIQUID COOLING OF ELECTRONIC RACKS OF A DATA CENTER

FIELD OF THE INVENTION

Embodiments of the present invention relate generally to data centers. More particularly, embodiments of the invention relate to a liquid distribution unit design for liquid cooling of electronic racks in data centers.

BACKGROUND

Heat removal is a prominent factor in a computer system and data center design. The number of high performance electronics components such as high performance processors packaged inside servers has steadily increased, thereby increasing the amount of heat generated and dissipated during the ordinary operations of the servers. The reliability of servers used within a data center decreases if the environment in which they operate is permitted to increase in temperature over time. Maintaining a proper thermal environment is critical for normal operations of these servers in data centers, as well as the server performance and lifetime. It requires more effective and efficient heat removal solutions especially in the cases of cooling these high performance servers.

Power intensive processors enable the solution of intensive computing such as deep learning. Electrical servers having those processors, i.e., high-power central processing units (CPUs) and/or general-purpose or graphical processing units (GPUs), have a very high power density per volumetric space. Liquid cooling is a proper thermal management solution for high power density.

In liquid cooling, a manifold is used for distributing and regulating fluid with main inlet/outlet ports and fluid sub-ports. The main inlet and outlet are connected to external cooling source, and the sub ports are connected with either server loops or cooling device loops. The fluid distribution manifold is a mature technology; however, most of the conventional manifold designs are not efficient in some application scenarios.

A common design is to have a supply manifold and a return manifold mechanically combined as one unit. However they are not thermally connected. For example, in a server level application (e.g., server level manifold), when there are multiple loops used in one server module, if the supply and return manifolds are not directly connected, the server level manifold needs to connect the liquid from the electronic rack and return the liquid back to the electronic rack. However, the liquid travels a long path, fluid pressure drop becomes higher, and the numbers of connectors and connection points increase and thus, the reliability decreases.

BRIEF DESCRIPTION OF THE DRAWINGS

Embodiments of the invention are illustrated by way of example and not limitation in the figures of the accompanying drawings in which like references indicate similar elements.

FIGS. 4A and 4B are block diagrams illustrating certain configurations of a liquid distribution unit according to certain embodiments.

DETAILED DESCRIPTION

Figure 1:
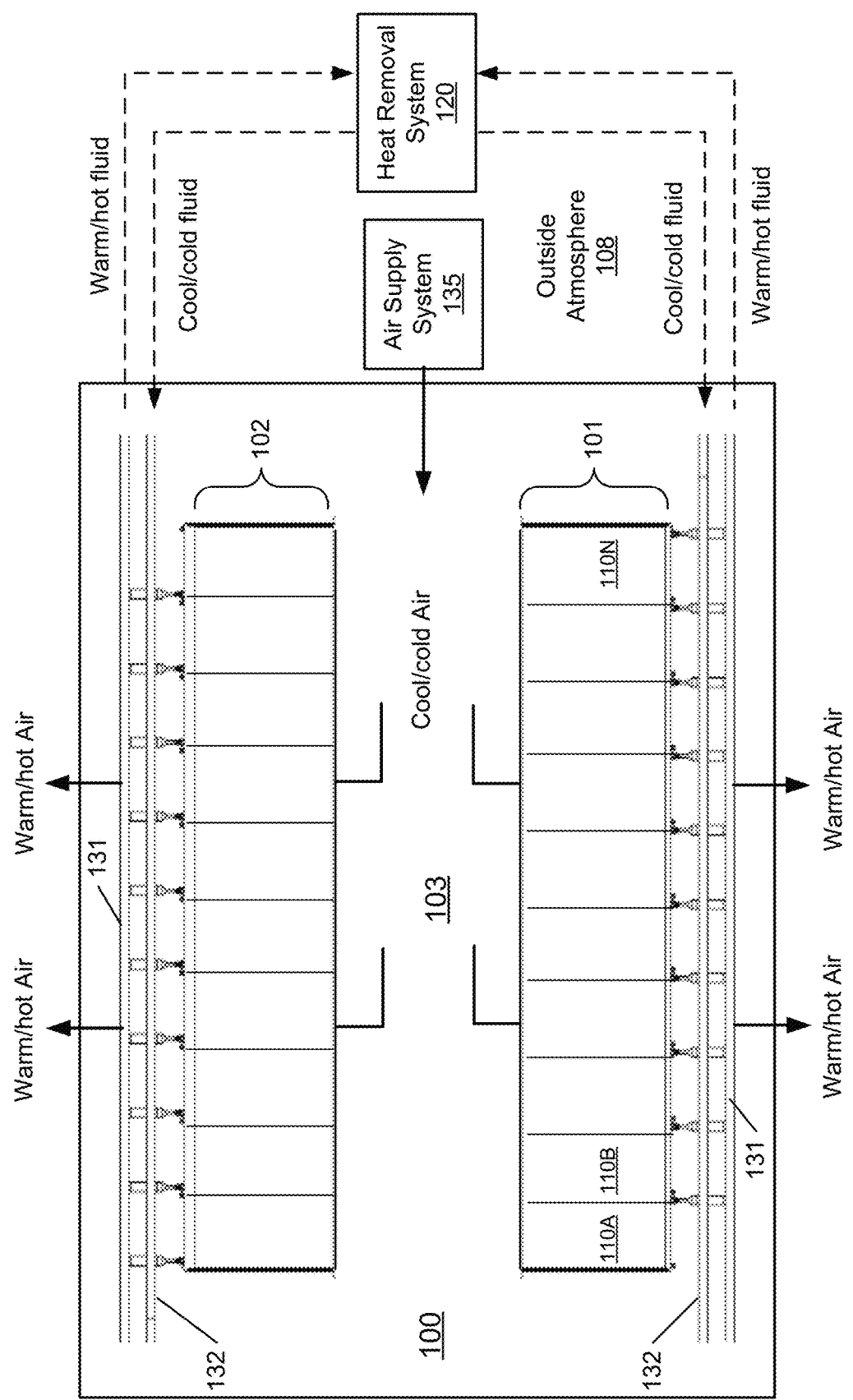
FIG. 1 is a block diagram illustrating an example of a data center facility according to one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Accordingly, a design for liquid distribution unit (LDU) is provided, where the fluid distribution unit is a combination of a cooling device and a manifold used for heat exchange and distributing cooling liquid for server liquid cooling. The LDU functions as a liquid distribution device as well as a cooling device. An effective design of an LDU may directly improve the total liquid cooling system design, system design flexibility, manufacturability, serviceability, reliability, and lowering the cost. One of the purposes of this design is to provide an advanced design of manifold which is more efficient and more reliable. One of the features of this design is the concept of sub-manifold that provides the device with high compatibility for different scenarios and use cases. This means that the number of sub-port can be adjustable on a single device. Another feature is that the manifold includes the cooling function imbedded therein, and it is also able to be used as a condensing heat exchange unit. An LDU distributes liquid to multiple sub-ports, which are connected with either server cooling loops or device cooling loops. The warmer fluid returns back to the device through return sub-ports. Inside the device, the warmer fluid gets cooled and heat is extracted to the cooling water loop.

According to an aspect of the invention, an electronic rack includes a rack manifold having a rack liquid supply line or channel and a rack liquid return line or channel. The liquid supply line is to receive first cooling liquid from a cooling liquid source and the liquid return line is to return first warmer liquid carrying the exchanged heat back to the cooling liquid source. The electronic rack further includes an array of server blades arranged in a stack therein. Each server blade includes one or more liquid cold plates associated with one or more information technology (IT) components. The electronic rack further includes a set of one or more liquid distribution units (LDUs) coupled between the rack manifold and the server blades.

In one embodiment, each LDU includes an LDU container, a liquid supply port, a liquid return port, one or more pairs of supply sub-ports and return sub-ports, and a heat exchange channel or tube. The liquid supply port, liquid return port, the LDU container, and the rack manifold form a primary liquid distribution loop. Each pair of a supply sub-port and a return sub-port is coupled to one of the heat exchange channel. A supply sub-port is configured to supply second cooling liquid to at least one cold plate of a server blade and return warmer second cooling liquid to the heat exchange channel for heat exchange. A heat exchange channel, an associated pair of support sub-port and return sub-port, and a liquid distribution tube coupled between the support/return sub-ports and a cold plate form a secondary liquid distribution loop. The heat exchange channel traverses through the first cooling liquid contained in the LDU container for heat exchange, without direct contact between the first cooling liquid and the second cooling liquid.

According to another aspect of the invention, an electronic rack includes a rack manifold having a rack liquid supply line and a rack liquid return line. The rack liquid supply line is configured to receive first cooling liquid from a cooling liquid source and the rack liquid return line is configured to return first warmer liquid back to the cooling liquid source. The electronic rack further includes an array of server blades arranged in a stack. Each server blade includes one or more cold plates associated with one or more IT components. The electronic rack further includes a set of one or more LDUs coupled between the rack manifold and the server blades. Each LDU includes a plate heat exchanger having a primary loop and a secondary loop, a liquid support port, a liquid return port, and one or more pairs of supply sub-ports and return sub-ports. The liquid supply port and the liquid return port are coupled to the primary loop of the plate heat exchanger. The supply sub-ports and return sub-ports are coupled to the secondary loop of the plate heat exchanger. Each pair of supply sub-port and return sub-port is configured to supply and return second cooling liquid to and from at least one of the cold plates of the server blades via a respective liquid distribution tube coupled to the cold plates.

According to a further aspect of the invention, a data center system includes an array of electronic racks. Each electronic rack contains a number of server blades inserted into a number of server slots within the electronic rack. Each server blade corresponds to one or more servers. In one embodiment, each electronic rack is configured similar to any one of the electronic racks set forth above.

FIG. 1 is a block diagram illustrating an example of a data center or data center unit according to one embodiment. In this example, FIG. 1 shows a top view of at least a portion of a data center. Referring to FIG. 1, according to one embodiment, data center system 100 includes rows of electronic racks of information technology (IT) components, equipment or instruments 101-102, such as, for example, computer servers or computing nodes that provide data services to a variety of clients over a network (e.g., the Internet). In this embodiment, each row includes an array of electronic racks such as electronic racks 110A-110N. However, more or fewer rows of electronic racks may be implemented. Typically, rows 101-102 are aligned in parallel with frontends facing towards each other and backends facing away from each other, forming aisle 103 in between to allow an administrative person walking therein. However, other configurations or arrangements may also be applied.

In one embodiment, each of the electronic racks (e.g., electronic racks 110A-110N) includes a housing to house a number of electronic racks of IT components operating therein. The electronic racks can include a heat removal liquid manifold, a number of server slots, and a number of server blades capable of being inserted into and removed from the server blades or server slots. Each server blade represents a computing node having one or more processors, a memory, and/or a persistent storage device (e.g., hard disk). At least one of the processors is attached to a liquid cold plate (also referred to as a cold plate assembly) to receive cooling liquid. In addition, one or more optional cooling fans are associated with the server blades to provide air cooling to the computing nodes contained therein. Note that the heat removal system 120 may be coupled to multiple data center systems such as data center system 100.

In one embodiment, heat removal system 120 includes an external liquid loop connected to a cooling tower or a dry cooler external to the building/housing container. The heat removal system 120 can include, but is not limited to evaporative cooling, free air, rejection to large thermal mass, and waste heat recovery designs. Heat removal system 120 may include or be coupled to a cooling liquid source that provide cooling liquid.

In one embodiment, each server blade is coupled to the heat removal liquid manifold modularly such that a server blade can be removed from the electronic rack without affecting the operations of remaining server blades on the electronic rack and the heat removal liquid manifold. In another embodiment, each server blade is coupled to the heat removal liquid manifold (also referred to as a cooling liquid manifold) through a quick-release coupling assembly having a first liquid intake connector and a first liquid outlet connector coupled to a flexible hose to distribute the heat removal liquid to the processors. The first liquid intake connector is to receive heat removal liquid via a second liquid intake connector from a heat removal liquid manifold mounted on a backend of the electronic rack. The first liquid outlet connector is to emit warmer or hotter liquid carrying the heat exchanged from the processors to the heat removal liquid manifold via a second liquid outlet connector and then back to a coolant distribution unit (CDU) within the electronic rack.

In one embodiment, the heat removal liquid manifold disposed on the backend of each electronic rack is coupled to liquid supply line 132 to receive heat removal liquid (also referred to as cooling liquid) from heat removal system 120. The heat removal liquid is distributed through a liquid distribution loop attached to a cold plate assembly on which a processor is mounted to remove heat from the processors. A cold plate is configured similar to a heat sink with a liquid distribution tube attached or embedded therein. The resulting warmer or hotter liquid carrying the heat exchanged from the processors is transmitted via liquid return line 131 back to heat removal system 120. Liquid supply/return lines 131-132 are referred to as data center or room liquid supply/return lines (e.g., global liquid supply/return lines), which supply heat removal liquid to all of the electronic racks of rows 101-102. The liquid supply line 132 and liquid return line 131 are coupled to a heat exchanger of a CDU located within each of the electronic racks, forming a primary loop. The secondary loop of the heat exchanger is coupled to each of the server blades in the electronic rack to deliver the cooling liquid to the cold plates of the processors.

In one embodiment, data center system 100 further includes an optional airflow delivery system 135 to generate an airflow to cause the airflow to travel through the air space of the server blades of the electronic racks to exchange heat generated by the computing nodes due to operations of the computing nodes (e.g., servers) and to exhaust the airflow exchanged heat to an external environment 108 outside of housing/room/building. For example, air supply system 135 generates an airflow of cool/cold air to circulate from aisle 103 through electronic racks 110A-110N to carry away exchanged heat. The cool airflows enter the electronic racks through their frontends and the warm/hot airflows exit the electronic racks from their backends. The warm/hot air with exchanged heat is exhausted from room/building. Thus, the cooling system is a hybrid liquid-air cooling system, where a portion of the heat generated by a processor is removed by cooling liquid via the corresponding cold plate, while the remaining portion of the heat generated by the processor (or other electronics or processing devices) is removed by airflow cooling.

Figure 2:
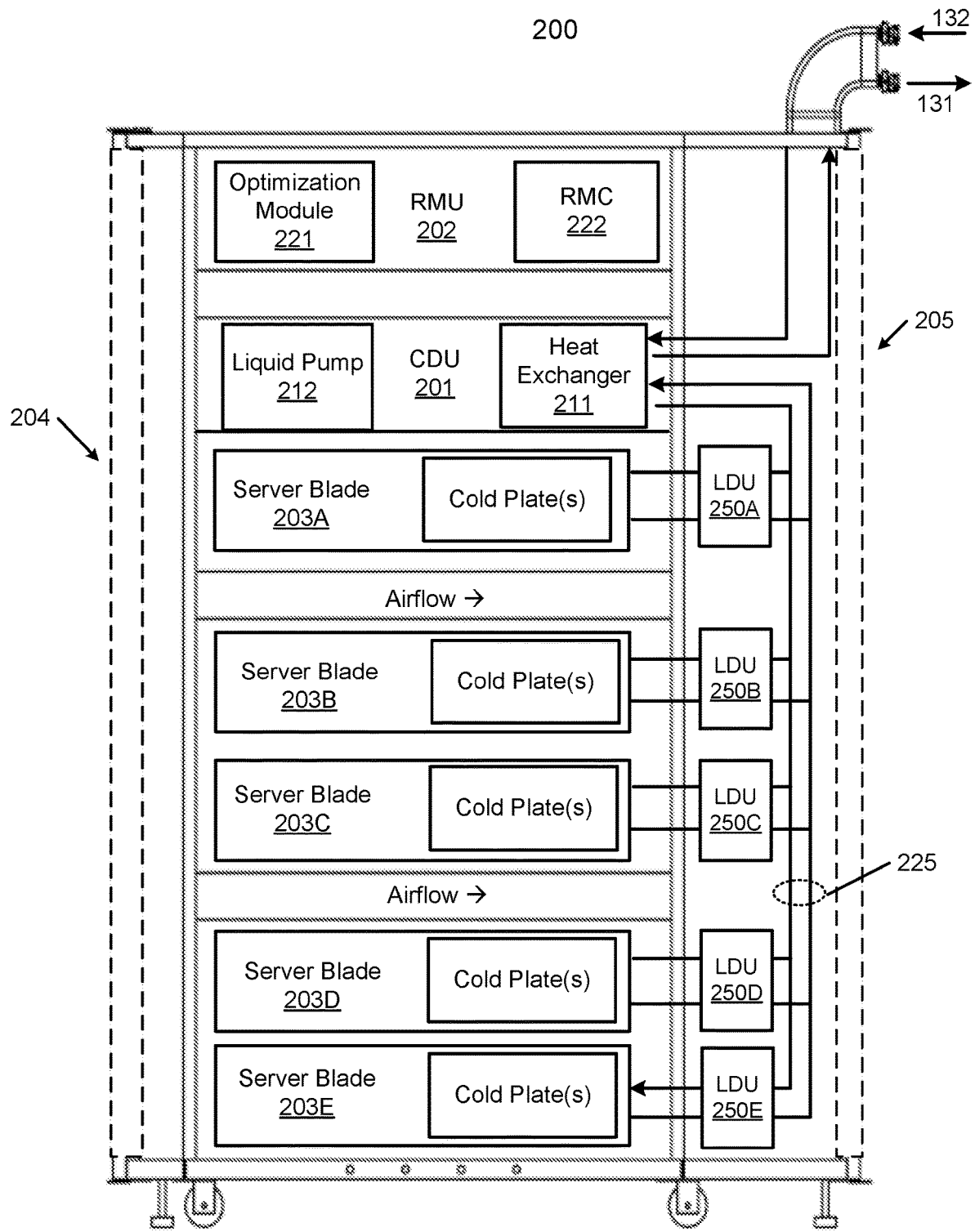
FIG. 2 is a block diagram illustrating an example of an electronic rack according to one embodiment.

FIG. 2 is block diagram illustrating an electronic rack according to one embodiment. Electronic rack 200 may represent any of the electronic racks as shown in FIG. 1, such as, for example, electronic racks 110A-110N. Referring to FIG. 2, according to one embodiment, electronic rack 200 includes, but is not limited to, CDU 201, optional RMU 202, and one or more server blades 203A-203E (collectively referred to as server blades 203). Server blades 203 can be inserted into an array of server slots respectively from frontend 204 or backend 205 of electronic rack 200. Note that although there are five server blades 203A-203E shown here, more or fewer server blades may be maintained within electronic rack 200. Also note that the particular positions of CDU 201, RMU 702, and server blades 203 are shown for the purpose of illustration only; other arrangements or configurations of CDU 201, RMU 202, and server blades 203 may also be implemented. In one embodiment, electronic rack 200 can be either open to the environment or partially contained by a rack container, as long as the cooling fans can generate airflows from the frontend to the backend.

In addition, for at least some of the server blades 203, an optional fan module (not shown) is associated with the server blade. Each of the fan modules includes one or more cooling fans. The fan modules may be mounted on the backends of server blades 203 or on the electronic rack to generate airflows flowing from frontend 204, traveling through the air space of the sever blades 203, and existing at backend 205 of electronic rack 200.

In one embodiment, CDU 701 mainly includes heat exchanger 711, liquid pump 712, and a pump controller (not shown), and some other components such as a liquid reservoir, a power supply, monitoring sensors and so on. Heat exchanger 211 may be a liquid-to-liquid heat exchanger. Heat exchanger 211 includes a first loop with inlet and outlet ports having a first pair of liquid connectors coupled to external liquid supply/return lines 131-132 to form a primary loop. The connectors coupled to the external liquid supply/return lines 131-132 may be disposed or mounted on backend 205 of electronic rack 200. The liquid supply/return lines 131-132, also referred to as room liquid supply/return lines, are coupled to heat removal system 120 as described above. In addition, heat exchanger 211 further includes a second loop with two ports having a second pair of liquid connectors coupled to liquid manifold 225 to form a secondary loop, which may include a supply manifold (also referred to as a rack liquid supply line) to supply cooling liquid to server blades 203 and a return manifold (also referred to as a rack liquid return line) to return warmer liquid back to CDU 201. Note that CDUs 201 can be any kind of CDUs commercially available or customized ones. Thus, the details of CDUs 201 will not be described herein.

Each of server blades 203 may include one or more IT components (e.g., central processing units or CPUs, graphical processing units (GPUs), memory, and/or storage devices). Each IT component may perform data processing tasks, where the IT component may include software installed in a storage device, loaded into the memory, and executed by one or more processors to perform the data processing tasks. Server blades 203 may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the performance computing nodes or compute servers (having one or more GPUs) managed by the host server. The performance compute servers perform the actual tasks, which may generate heat during the operations.

Electronic rack 200 further includes optional RMU 202 configured to provide and manage power supplied to servers 203, and CDU 201. RMU 202 may be coupled to a power supply unit (not shown) to manage the power consumption of the power supply unit. The power supply unit may include the necessary circuitry (e.g., an alternating current (AC) to direct current (DC) or DC to DC power converter, battery, transformer, or regulator, etc.,) to provide power to the rest of the components of electronic rack 200.

In one embodiment, RMU 202 includes optimization module 221 and rack management controller (RMC) 222. RMC 222 may include a monitor to monitor operating status of various components within electronic rack 200, such as, for example, computing nodes 203, CDU 201, and fan modules 231. Specifically, the monitor receives operating data from various sensors representing the operating environments of electronic rack 200. For example, the monitor may receive operating data representing temperatures of the processors, cooling liquid, and airflows, which may be captured and collected via various temperature sensors. The monitor may also receive data representing the fan power and pump power generated by the fan modules 231 and liquid pump 212, which may be proportional to their respective speeds. These operating data are referred to as real-time operating data. Note that the monitor may be implemented as a separate module within RMU 202.

Based on the operating data, optimization module 221 performs an optimization using a predetermined optimization function or optimization model to derive a set of optimal fan speeds for fan modules 231 and an optimal pump speed for liquid pump 212, such that the total power consumption of liquid pump 212 and fan modules 231 reaches minimum, while the operating data associated with liquid pump 212 and cooling fans of fan modules 231 are within their respective designed specifications. Once the optimal pump speed and optimal fan speeds have been determined, RMC 222 configures liquid pump 212 and cooling fans of fan modules 231 based on the optimal pump speeds and fan speeds.

As an example, based on the optimal pump speed, RMC 222 communicates with a pump controller of CDU 201 to control the speed of liquid pump 212, which in turn controls a liquid flow rate of cooling liquid supplied to the liquid manifold 225 to be distributed to at least some of server blades 203. Similarly, based on the optimal fan speeds, RMC 222 communicates with each of the fan modules to control the speed of each cooling fan of the fan modules 231, which in turn control the airflow rates of the fan modules. Note that each of fan modules may be individually controlled with its specific optimal fan speed, and different fan modules and/or different cooling fans within the same fan module may have different optimal fan speeds.

Figure 3:
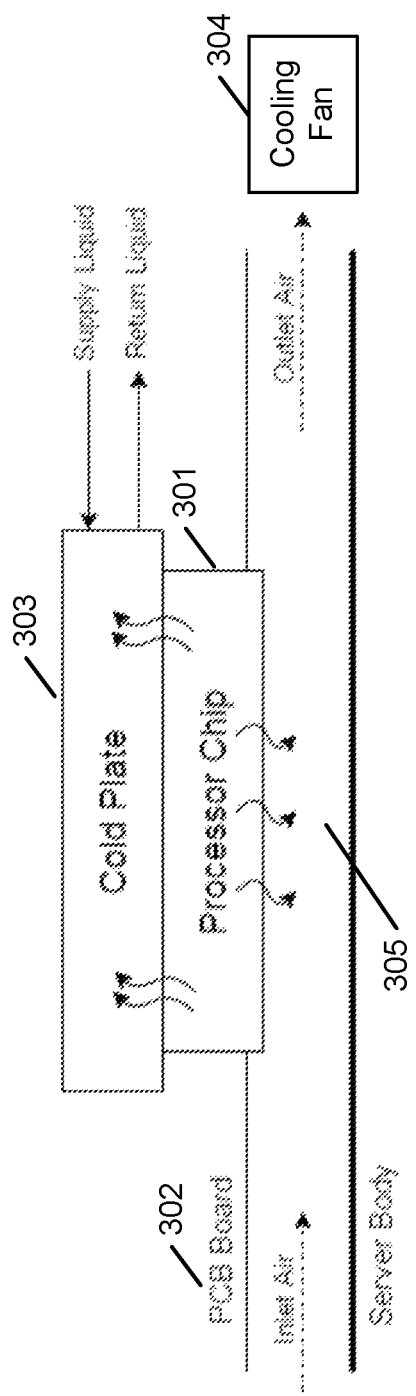
FIG. 3 is a block diagram illustrating an example of a cold plate configuration according to one embodiment.

FIG. 3 is a block diagram illustrating a processor cold plate configuration according to one embodiment. The processor/cold plate structure 400 can represent any of the processors/cold plate structures of server blades 203 as shown in FIG. 2. Referring to FIG. 3, processor 301 is plugged onto a processor socket mounted on printed circuit board (PCB) or motherboard 302 coupled to other electrical components or circuits of a data processing system or server. Processor 301 also includes a cold plate 303 attached to it, which is coupled to liquid supply line 132 and liquid return line 131. A portion of the heat generated by processor 301 is removed by the cooling liquid via cold plate 303. The remaining portion of the heat enters into air space 305 underneath, which may be removed by an airflow generated by cooling fan 304.

Referring back to FIG. 2, according to one embodiment, electronic rack 200 further includes one or more LDUs, such as LDUs 250A-250E (collectively referred to as LDUs 250), positioned between server blades 203 and rack manifolds 225. Each LDU operates as a local liquid distribution manifold and also a cooling device to a server blade. In FIG. 2, a LDU 250 are shown outside of the server, but it can be designed in the server or outside of the server. In this example, there is an LDU corresponding to one of the server blades 203. However, in other embodiments, although not shown, an LDU can be associated with multiple server blades.

Similar to a CDU, a primary loop is formed between an LDU and rack manifold 225, while a secondary loop is formed between the LDU and a server blade. As a result, the liquid distribution loop is significantly shortened compared a conventional system. In a conventional system, the cooling liquid received either from supply line 132 or from CDU 201 has to travel through each of the cold plates in server blades 203. As a result, the liquid distribution loop is much longer and the power to pump the liquid requires much higher. With LDUs 250, each secondary loop coupled to the cold plates of a server blade is a local individual loop. In one embodiment, the cooling liquid distributed to the server blade is a two-phase cooling liquid that transitions between a liquid form and a vapor form based on the temperature. In such a configuration, a liquid pump for the secondary loop may not be needed.

FIG. 4A is a block diagram illustrating a liquid distribution unit according to one embodiment. Referring to FIG. 4A, electronic rack 400 may be implemented as a part of electronic rack 200 as shown in FIG. 2. In this example, electronic rack 400 includes a rack manifold having a rack liquid supply line 225A and a rack liquid return line 225B. Supply line 225A is configured to receive and supply cooling liquid to LDUs 401-402. Liquid return line 225B is configured to receive warmer liquid from LDUs 401-402 and return the warmer liquid upstream. In one embodiment, each of LDUs 401-402 is associated with one or more server blades. In this example, LDU 401 is associated with server blade 411, while LDU 402 is associated with server blades 412-413.

In one embodiment, each LDU includes a LDU container, a liquid supply port, a liquid return port, and one or more pairs of liquid supply sub-ports and return sub-ports. For example, LDU 401 includes a LDU container 420, a liquid supply port 421 and a liquid return port 422 disposed on the wall of LDU container 420. Liquid supply port 421 is configured to receive cooling liquid from rack supply line 225A, where the cooling liquid is contained within LDU container 420. Liquid return port 422 is configured to return the liquid carrying the exchanged heat back to liquid return line 225B. Thus, the cooling liquid is contained and circulated within LDU container 420 to form a primary loop with rack supply line 225A and return line 225B via supply port 421 and return port 422. An optional liquid pump may be disposed to help circulating the liquid within LDU container 420, for example, by pumping the cooler liquid into LDU container 420 from supply line 225A and return warmer liquid from LDU container 420 back to return line 225B.

LDU 401 further includes a pair of liquid supply sub-port 423 and liquid return sub-port 424 disposed on the wall of LDU container 420. Liquid supply sub-port 423 is coupled to a first end of heat exchange channel or heat exchange tube 425 and liquid return sub-port 424 is coupled a second end of heat exchange channel 425, where the heat exchange channel or tube 425 is located inside of LDU container 420 for the heat exchange with the cooling liquid (referred to herein as first cooling liquid) contained within LDU container 420 without the direct contact between the first cooling liquid from rack manifold and the cooling liquid (or vapor) circulated within heat exchange channel 425 (referred to herein as second cooling liquid).

From the outside, a first end of a liquid distribution tube 426 may be connected to liquid supply sub-port 423 while a second end of liquid distribution tube 426 may be connected to liquid return sub-port 424 to form a secondary loop. Liquid distribution tube is coupled to at least one cold plate 430 of server blade 411 to distribute and circulate the second cooling liquid to the cold plate 430. In one embodiment, the first end and second end of liquid distribution tube are connected to liquid supply sub-port 423 and liquid return sub-port 424 via a quick release connector, such that the liquid distribution tube, as well as server blade 411 can be easily connected and disconnect without liquid leaking. Similarly, rack supply line 225A may be coupled to liquid supply port 421 rack return line 225B may be coupled to liquid return port 422 via a respective quick release connector, such that LDU 401 can be easily connected and disconnected to and from the rack manifold.

In this example, LDU 401 is coupled to one server blade. However, an LDU such as LDU 402 may include multiple pairs of liquid supply and return sub-ports that can be coupled to multiple cold plates of a server blade or they can be coupled to multiple server blades. In this embodiment, an LDU container is used as a liquid reservoir for containing the first cooling liquid received from the rack manifold for exchanging heat carried by the second cooling liquid using a heat exchange channel embedded in the first cooling liquid within the LDU container.

Figure 5:
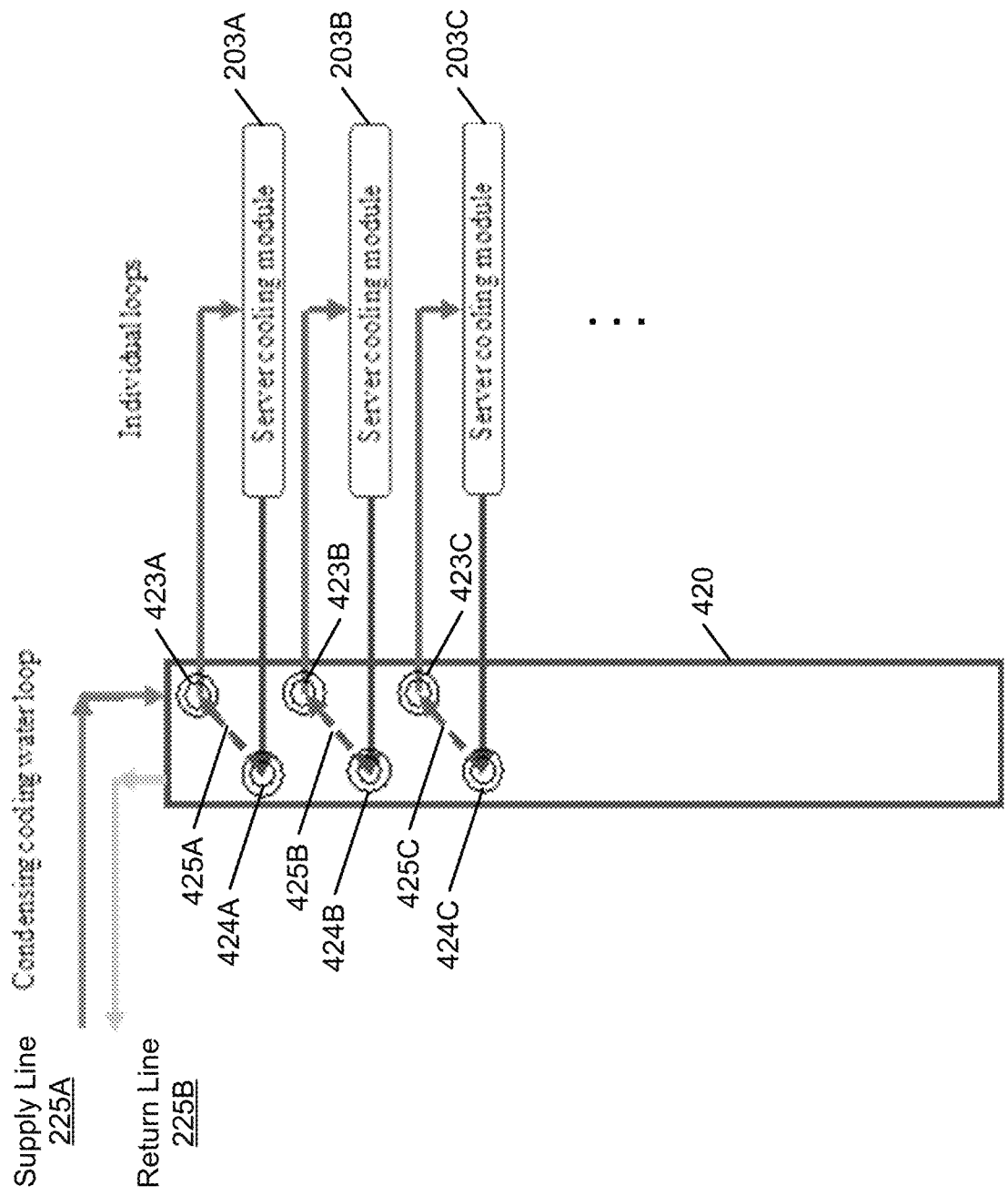
FIG. 5 is a block diagram illustrating a liquid distribution unit according to one embodiment.

Alternatively, according to another embodiment, liquid supply/return ports 421-422 and liquid supply/return sub-ports 423-424 may be coupled to a heat exchanger such as heat exchanger 440 of system 450, as shown in FIG. 4B. Heat exchanger 440 may be a plate heat exchanger. A plate heat exchanger is a type of heat exchanger that uses metal plates to transfer heat between two fluids. This has a major advantage over a conventional heat exchanger in that the fluids are exposed to a much larger surface area because the fluids spread out over the plates. This facilitates the transfer of heat, and greatly increases the speed of the temperature change. In this example, LDU container 420 may be optional. FIG. 5 shows another configuration, where an LDU container can contain multiple pairs of liquid supply 423A-423C and return sub-ports 424A-424C, coupled together by multiple heat exchange channel or tube 425A-425C.

In one embodiment, the second cooling liquid may be a two-phase cooling liquid. A two-phase cooling liquid is in a liquid state as the temperature stays low and transitions to an air state as the temperature rises and reaches to its boiling point, where the entire liquid distribution loop is referred to as a heat pipe.

A heat pipe is a hollow tube containing a heat transfer liquid. The liquid absorbs heat and evaporates at one end of the pipe. The vapor travels to the other (cooler) end of the tube, where it condenses, giving up its latent heat. The liquid returns to the hot end of the tube by gravity or capillary action and repeats the cycle. Heat pipes have a much higher effective thermal conductivity than solid materials.

Referring back to FIG. 4A, when the second cooling liquid leaves liquid supply sub-port in a direction towards cold plate 430, the second cooling liquid is in a liquid form. When the second cooling liquid flows through the distribution loop of cold plate 430, as the temperature rises, the second cooling liquid evaporates into vapor. The vapor travels through the returning path of the distribution loop entering return sub-port 422 into heat exchange channel 425, the vapor turns back into a liquid form due to the heat exchange. As a result, a liquid pump on the secondary loop between LDU 401 and cold plate 430 may not be needed.

Figure 6A:
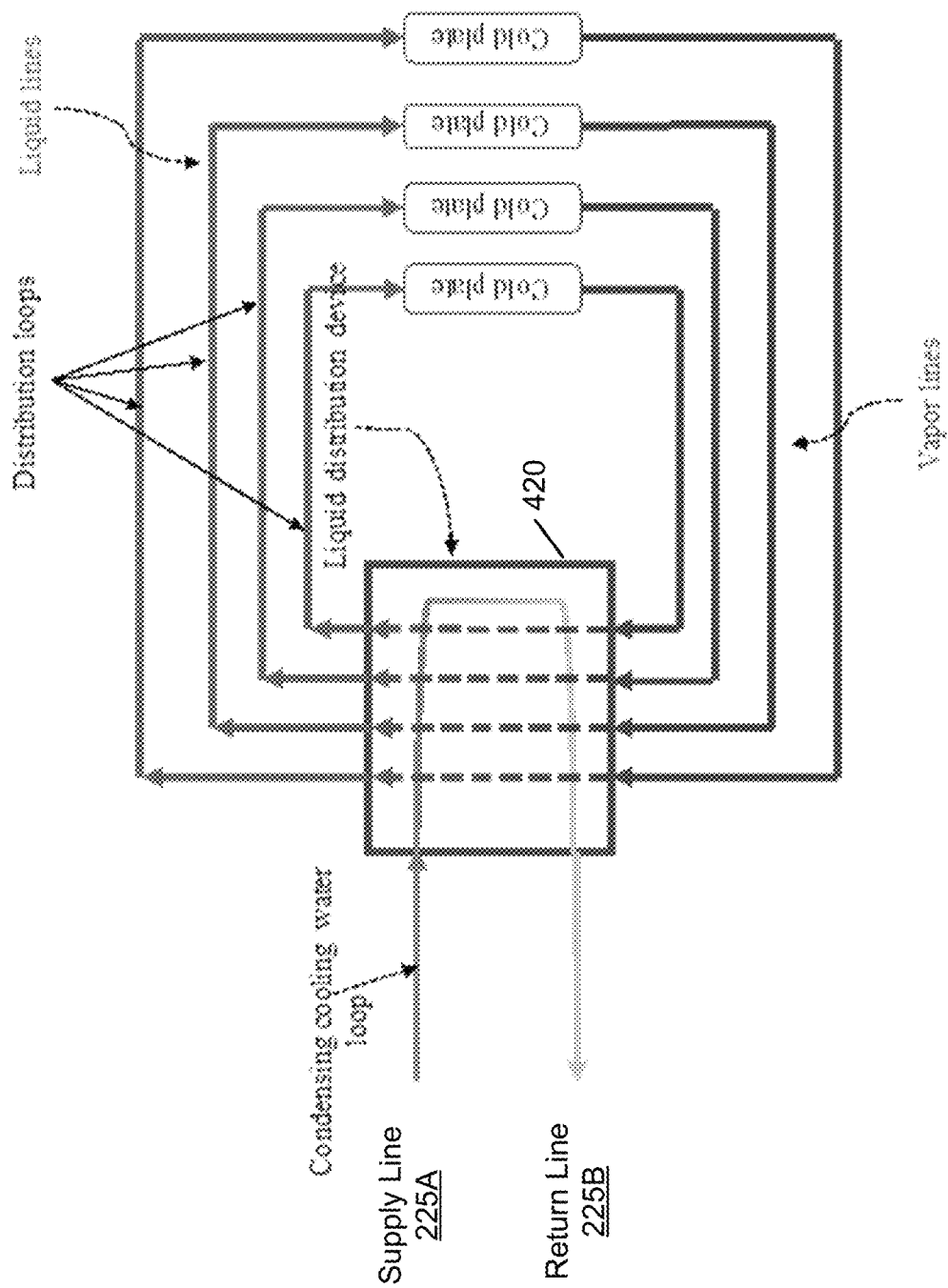
FIGS. 6A and 6B are block diagram illustrating two-phase liquid distribution according to certain embodiments.
Figure 6B:
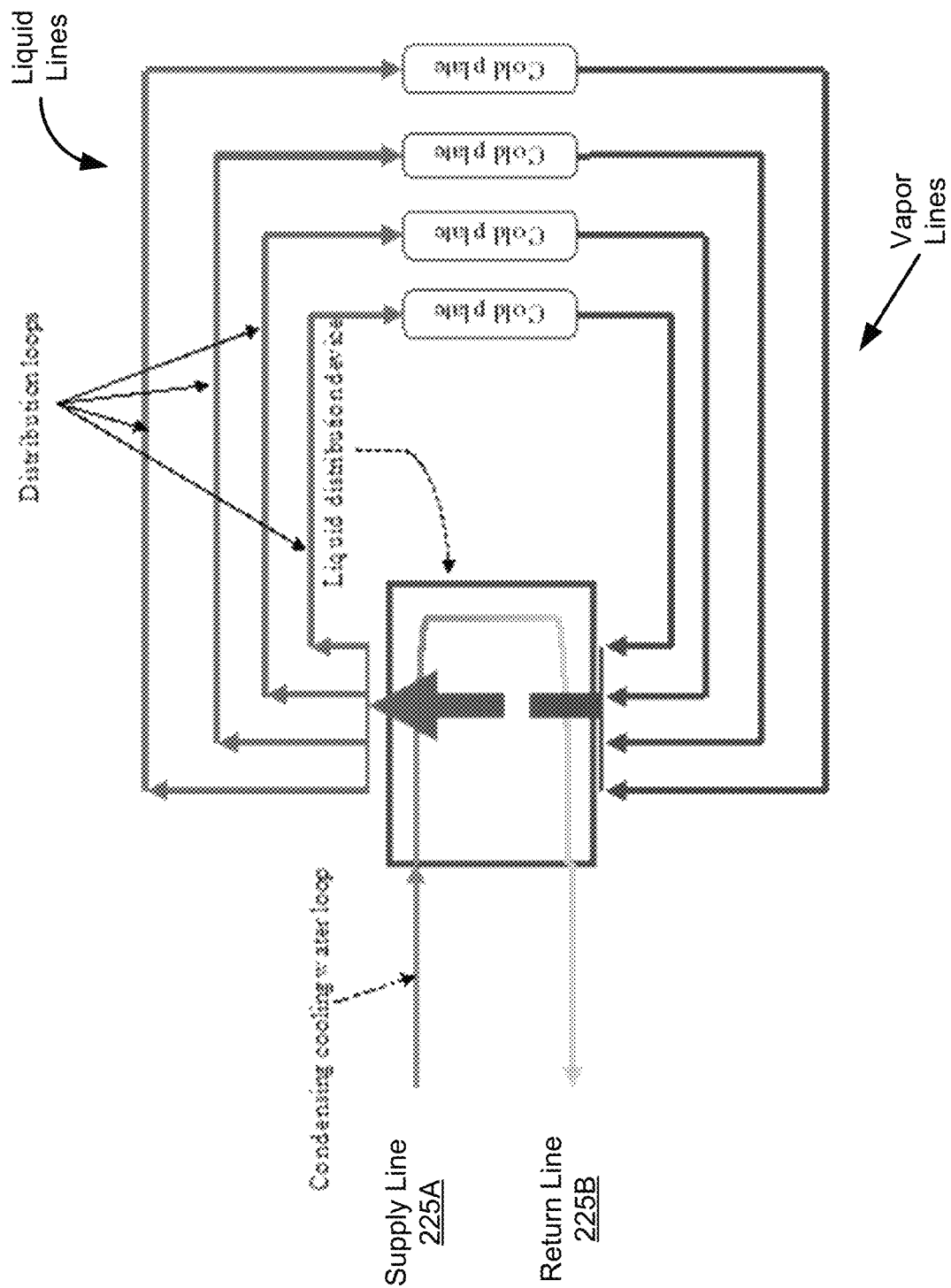

Referring now to FIG. 6A, in this example, there are multiple pairs of liquid supply and return sub-ports disposed on an LDU container that contains the first cooling liquid received from the rack manifold 225. When the second liquid leaves LDU container 420 towards the cold plates, the second cooling liquid is in a form of liquid, of which the distribution lines are referred to as liquid lines. After the heat exchange at the cold plates, the second cooling liquid evaporates into a vapor form, of which the distribution lines are referred to as vapor lines. The vapor enters LDU container 420 via the corresponding return sub-ports and the vapor turns into a liquid form again via the heat exchange channels. FIG. 6B shows an alternative embodiment, in which the heat exchange channel or tube has been aggregated into a single heat exchange channel or tube within LDU container 420. Note that as described above, the configurations in FIGS. 6A and 6B can also be implemented using a plate heat exchanger disposed within LDU container 420, similar to the configuration as shown in FIG. 4B.

As described above, the liquid distribution lines forming the secondary loop between an LDU and a cold plate can be connected using quick release connectors, such that the distribution lines can be easily connected to and disconnected from the LDU without liquid leaking. Specifically, a quick release connector is disposed on each of the liquid supply sub-port and liquid return sub-port. The terminals of the distribution lines are also attached to a quick release connector counterpart. As a result, each distribution line can be easily connected to or disconnected from the corresponding sub-port.

In addition, as described above, multiple pairs of liquid supply/return sub-ports may be disposed on the wall of an LDU container to provide liquid cooling to multiple cold plates and/or multiple server blades. However, such a configuration may require a prearrangement of the number of sub-ports disposed on the LDU container. Sometimes, not all of the pairs of sub-ports are needed. By directly mounting the sub-ports onto an LDU container lacks flexibility and it is difficult to change the number of sub-ports once the LDU design is completed. According to one embodiment, a connector member is utilized to connect the multiple distribution lines to an LDU, where the connector member can be connected to a single sub-port disposed on an LDU container, while there are multiple sub-ports disposed on the connector member. The connector member is connected to a sub-port of an LDU container via a quick release connector, such that the connector member can be easily attached to or detached from the LDU container.

Figure 7A:
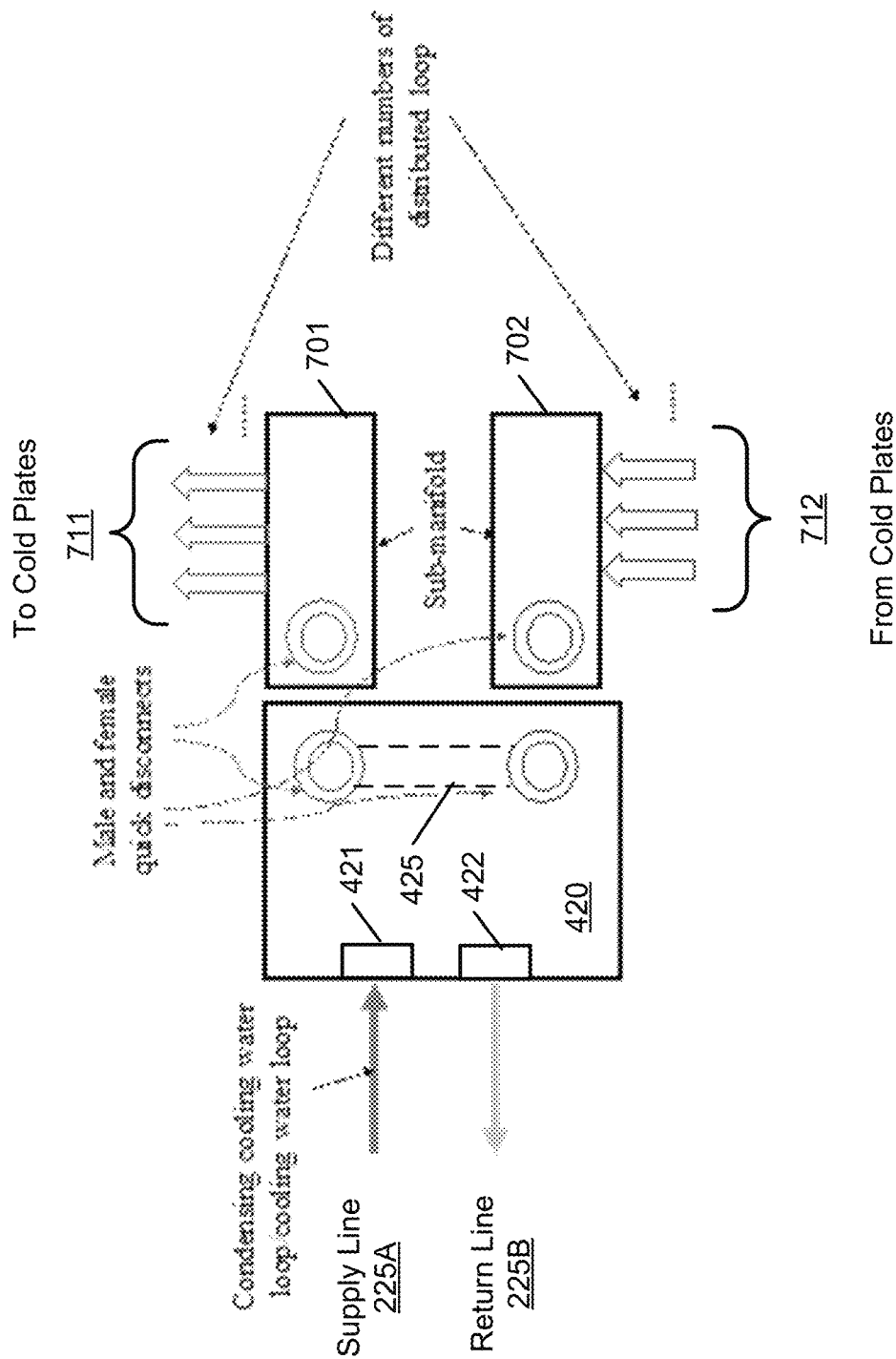
FIGS. 7A-7C are block diagrams illustrating examples of connector members according to one embodiment.
Figure 7B:
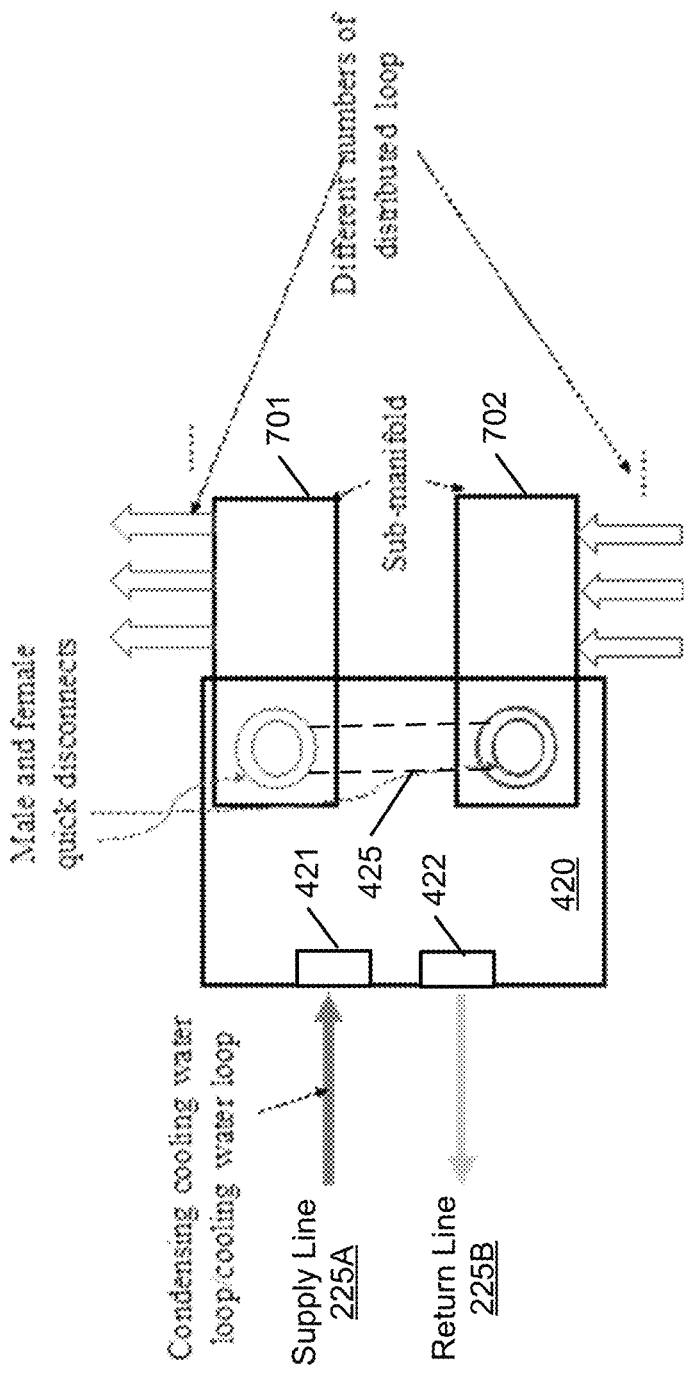
Figure 7C:
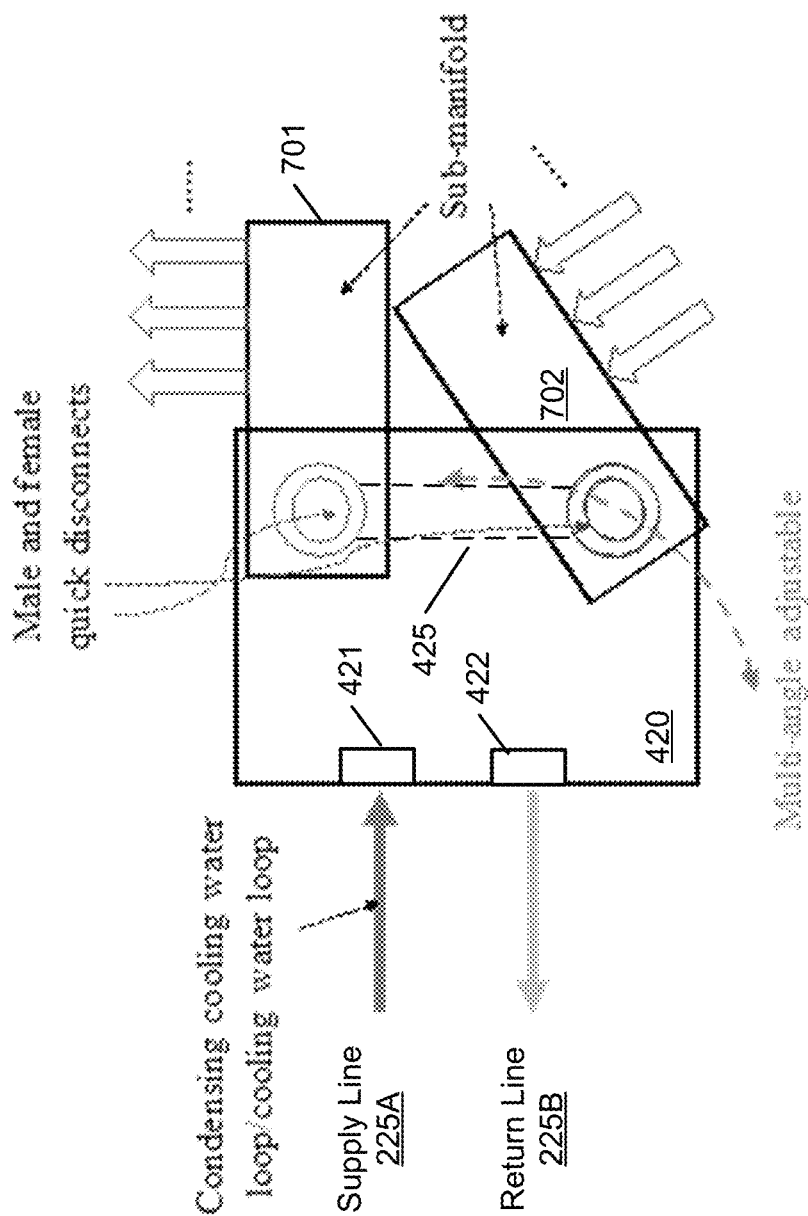

FIGS. 7A-7C are block diagrams illustrating certain embodiments of a liquid distribution unit according to one embodiment. Referring to FIG. 7A, an LDU further includes a pair of supply connector member 701 and return connector member 702. Supply connector member 701 is coupled to a first end of heat exchange tube 425 via a quick release connector mounted on the wall of LDU container 420. Return connector member 702 is coupled to a second end of heat exchange tub 425 via a quick release connector mounted on the wall of LDU container. FIG. 7B shows the configuration in which connector members 701-702 have been coupled to LDU container 420 via the corresponding quick release connectors.

The supply sub-ports 711 are disposed on supply connector member 701, where the cooling liquid flows from the corresponding quick release connector to supply sub-ports 711 within supply connector member 701. The return sub-ports 712 are disposed on return connector member 702, where the cooling liquid flows from return sub-ports 712 to the corresponding quick release connector within supply connector member 702. Note that the number of supply/return sub-ports 711-712 disposed on the supply/return connector members 701-702 may vary dependent upon the specific application. Since the connector members 701-702 can be easily connected to and disconnected from LDU container 420, they can be easily replaced with another connector member. As a result, the number of sub-ports 711-712 can be easily adjusted by replacing with a different connector member having a different number of sub-ports disposed thereon.

Given the nature of a quick release connector, each of the connector members 701-702 can be rotated or tilted with respect to LDU container 420 as shown in FIG. 7C. Also note that instead of using LDU container 420 to contain cooling liquid received from rack manifold 225, ports 421-422 and connector members 701-702 can be coupled to a primary loop and a secondary loop of a heat exchanger such as a plate heat exchanger as described above.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. An electronic rack of a data center, comprising:
   a rack manifold having a rack liquid supply line to receive first cooling liquid from a cooling liquid source and a rack liquid return line to return first warmer liquid back to the cooling liquid source;
   a plurality of server blades arranged in a stack, each server blades including one or more cold plates associated with one or more information technology (IT) components; and a set of one or more liquid distribution units (LDUs) coupled between the rack manifold and the server blades, wherein each LDU includes an LDU container,
 a liquid supply port to receive the first cooling liquid from the rack supply line to be contained within the LDU container,
 a liquid return port to return the first warmer liquid from the LDU container to the rack liquid return line to form a primary liquid distribution loop,
 one or more pairs of supply sub-ports and return sub-ports, each pair supplying and returning second cooling liquid to and from at least one of the cold plates of the server blades, and
 a heat exchange channel coupled to the pairs of supply sub-ports and return sub-ports to form a secondary liquid distribution loop, wherein the heat exchange channel traverses through the first cooling liquid contained in the LDU container for heat exchange, without direct contact between the first cooling liquid and the second cooling liquid.

2. The electronic rack of claim 1, wherein the pairs of supply sub-ports and return sub-ports comprise a first pair of sub-ports coupled to a first cold plate of a first of the server blades and a second pair of sub-ports coupled to a second cold plate of the first server blade.

3. The electronic rack of claim 1, wherein the pairs of supply sub-ports and return sub-ports comprise a first pair of sub-ports coupled to a first cold plate of a first of the server blades and a second pair of sub-ports coupled to a second cold plate of a second of the server blades.

4. The electronic rack of claim 1, wherein the second cooling liquid is a two-phase cooling fluid that leaves a supply sub-port in a fluid form, goes through a cold plate for heat exchange, and returns to a return sub-port in a vapor form.

5. The electronic rack of claim 1, wherein each LDU further comprises:
 a supply connector member coupled to a first end of the heat exchange channel, wherein the supply sub-ports are disposed on the supply connector member; and
 a return connector member coupled to a second end of the heat exchange channel, wherein the return sub-ports are disposed on the return connector member.

6. The electronic rack of claim 5, wherein the supply connector member is coupled to the first end of the heat exchange channel via a first connector disposed on a wall of the LDU container, and wherein the return connector member is coupled to the second end of the heat exchange channel via a second connector disposed on the wall of the CDU container.

7. The electronic rack of claim 6, wherein the first connector is a first quick release connector such that the supply connector member can connect with and disconnect from the first end of the heat exchange channel without leaking.

8. The electronic rack of claim 7, wherein the supply connector member can rotate with respect to the LDU container while coupling with the first end of the heat exchange channel through the first quick release connector.

9. The electronic rack of claim 6, wherein the second connector is a second quick release connector such that the return connector member can connect with and disconnect from the second end of the heat exchange channel without leaking.

10. The electronic rack of claim 9, wherein the return connector member can rotate with respect to the LDU container while coupling with the second end of the heat exchange channel through the second quick release connector.

11. The electronic rack of claim 1, wherein the heat exchange channel comprises a plurality of heat exchange sub-channels, each heat exchange sub-channel corresponding to one of the pairs of supply sub-ports and return sub-ports.

12. A data center system, comprising:
 an array of electronic racks, each electronic racks containing a plurality of server blades and each server blade corresponding to one or more servers, wherein each electronic rack comprises:
  a rack manifold having a rack liquid supply line to receive first cooling liquid from a cooling liquid source and a rack liquid return line to return first warmer liquid back to the cooling liquid source;
  a plurality of server blades arranged in a stack, each server blades including one or more cold plates associated with one or more information technology (IT) components; and
  a set of one or more liquid distribution units (LDUs) coupled between the rack manifold and the server blades, wherein each LDU includes a LDU container,
   a liquid supply port to receive the first cooling liquid from the rack supply line to be contained within the LDU container,
   a liquid return port to return the first warmer liquid from the LDU container to the rack liquid return line to form a primary liquid distribution loop,
   one or more pairs of supply sub-ports and return sub-ports, each pair supplying and returning second cooling liquid to and from at least one of the cold plates of the server blades, and
   a heat exchange channel coupled to the pairs of supply sub-ports and return sub-ports to form a secondary liquid distribution loop, wherein the heat exchange channel traverses through the first cooling liquid contained in the LDU container for heat exchange, without direct contact between the first cooling liquid and the second cooling liquid.

13. The data center system of claim 12, wherein the pairs of supply sub-ports and return sub-ports comprise a first pair of sub-ports coupled to a first cold plate of a first of the server blades and a second pair of sub-ports coupled to a second cold plate of the first server blade.

14. The data center system of claim 12, wherein the pairs of supply sub-ports and return sub-ports comprise a first pair of sub-ports coupled to a first cold plate of a first of the server blades and a second pair of sub-ports coupled to a second cold plate of a second of the server blades.

15. The data center system of claim 12, wherein the second cooling liquid is a two-phase cooling fluid that leaves a supply sub-port in a fluid form, goes through a cold plate for heat exchange, and returns to a return sub-port in a vapor form.

16. The data center system of claim 12, wherein each LDU further comprises:
 a supply connector member coupled to a first end of the heat exchange channel, wherein the supply sub-ports are disposed on the supply connector member; and
 a return connector member coupled to a second end of the heat exchange channel, wherein the return sub-ports are disposed on the return connector member.

17. The data center system of claim 16, wherein the supply connector member is coupled to the first end of the heat exchange channel via a first connector disposed on a wall of the LDU container, and wherein the return connector member is coupled to the second end of the heat exchange channel via a second connector disposed on the wall of the CDU container.

\* \* \* \* \*